United States Patent [19]

Yukimoto

[11] 4,275,408

[45] Jun. 23, 1981

[54] THYRISTOR

[75] Inventor: Yoshinori Yukimoto, Itami, Japan

[73] Assignee: Mitsubishi Denki Kabushiki Kaisha, Tokyo, Japan

[21] Appl. No.: 165,480

[22] Filed: Jul. 3, 1980

[30] Foreign Application Priority Data

Jul. 9, 1979 [JP] Japan .................................. 54-87616

[51] Int. Cl.³ ............................................ H01L 29/74
[52] U.S. Cl. ....................................... 357/38; 357/20; 357/89
[58] Field of Search ......................... 357/20, 38, 52, 89

[56] References Cited

U.S. PATENT DOCUMENTS

| 3,971,061 | 7/1976 | Matsushita et al. | 357/52 |
| 4,003,072 | 1/1977 | Matsushita et al. | 357/38 |
| 4,035,825 | 7/1977 | Kirschner | 357/20 |
| 4,035,828 | 7/1977 | Einthoven et al. | 357/20 |
| 4,198,645 | 4/1980 | Nishizawa | 357/38 |

Primary Examiner—Joseph E. Clawson, Jr.
Attorney, Agent, or Firm—C. L. Menzemer

[57] ABSTRACT

This invention relates to a thyristor and more particularly to improvements to increase the withstand voltage and increase the control speed of a thyristor.

5 Claims, 3 Drawing Figures

THYRISTOR

BACKGROUND OF THE INVENTION

1. Field of the Invention

The present invention is in the field of semi-conductor devices generally and is specifically directed to thyristors.

2. Description of the Prior Art

With reference to FIG. 1, there is shown a typical prior art thyristor.

The prior art thyristor is comprised of a p type anode emitter layer 12, and n type anode base layer 14 adjacent to the emitter layer 12. A p-n junction 16 is between regions 12 and 14. There is a p type cathode base region 18 adjacent to region 12 and a p-n junction 20 between regions 14 and 18. There is an n type cathode emitter region 22 formed on a portion of one surface of region 18 and a p-n junction 24 between regions 18 and 22.

A metal anode electrode 26 is affixed in an electrical ohmic contact relationship on surface 28 of region 12.

A metal cathode electrode 29 is affixed in an electrical ohmic contact relationship with surface 30 of region 22.

A metal gate contact electrode 32 is affixed in an electrical ohmic contact relationship with surface 34 of region 32.

A "turn-on" time prescribing a control speed of such a thyristor depends greatly upon a time interval "$t_1$" for which electrons from the cathode emitter region 22 injected into the cathode base region 18 are diffused through the cathode base region 18 to reach anode base region 14, and a second time interval "$t_2$" for which holes from the anode emitter region 12, injected into the anode base region 14, are diffused through this region 14 to reach the cathode base region 18. On the other hand, in order to increase a withstanding voltage upon the application of a forward voltage, it is necessary to thicken, as a matter of course, the thickness of the anode base layer 14 and to thicken the thickness "$W_{B1}$" of the cathode base region 18 between the cathode emitter region 22 and the anode base region 14 while rendering the impurity concentration of the cathode base region 18 sufficiently large which brings increases in the above-mentioned time intervals "$t_1$" and "$t_2$".

Thus, in conventional thyristor, the speeding-up of the control speed is contradictory to a high withstanding voltage. Also there has been a problem that a speed at which the principal current is interrupted cannot be high because the quantity of holes injected into the anode base region 14 from the anode emitter region 12 is large.

With the above-mentioned problems in view, the present invention has been made to provide a thyristor capable of speeding up its control speed without lowering the withstanding voltage lower by making a structure such that, upon the application of a forward voltage, a voltage applied to a base layer on which a gate electrode is provided can be rendered small.

SUMMARY OF THE INVENTION

The present invention comprises a thyristor formed by four successive adjoining regions, said regions comprising an emitter of a first type conductivity, a first base region of a second type conductivity, a second base region of the first type conductivity and a second emitter region of the second type conductivity, p-n junction's between adjacent regions, characterized in that gate regions of the second type conductivity are provided at predetermined intervals on a boundary surface between said base region of the first type conductivity and said base region of the second type conductivity to protrude in the form of islands or a comb-like structure into said base region of the first type conductivity from said base region of the second type conductivity while high impurity concentration regions of the first type conductivity are provided only on portions not vertically opposing to said gate regions of the second type conductivity on a boundary surface between said base region of the first type conductivity and said emitter region of the second type conductivity or, a high impurity concentration region is provided to be thicker on said portions than on the remaining portions.

BRIEF DESCRIPTION OF THE DRAWINGS

For a better understanding of the nature of the present invention reference should be had to the following detailed description and drawings in which.

DESCRIPTION OF THE PREFERRED EMBODIMENTS

Figure 1:
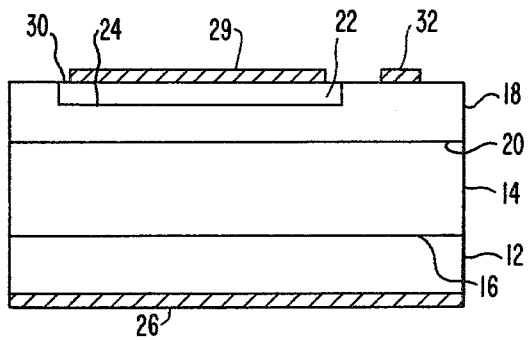
FIG. 1 is a side view, in section, or a prior art thyristor.
Figure 2:
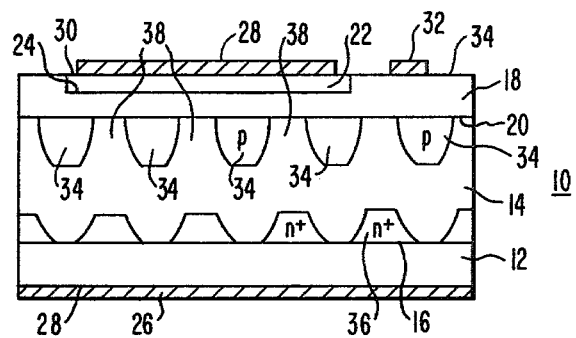
FIG. 2 is a side view, in section, of a thyristor setting forth the teachings of the present invention.

With reference to FIG. 2, there is shown a thyristor 10. All like components found in the thyristor of FIG. 1 and the thyristor of FIG. 2 are designated by the same numerals.

The thyristor 10 is comprised of a p type emitter region 12, and n type base region 14 adjacent to said region 12 with a p-n junction 16 between regions 12 and 14; a p type base region 18, a p-n junction 20 between regions 14 and 18; an n type emitter region 22 with a p-n junction 24 between regions 18 and 22.

An anode metal electrode 26 is affixed in ohmic electrical contact to surface 28 of region 12. A cathode metal electrode 29 is affixed in ohmic electrical contact to surface 30 of region 22 and a gate electrode 32 is affixed in ohmic electrical contact with surface 34 of region 18.

P type gate regions 34 are provided at predetermined intervals along the p-n junction 20 between the base regions 14 and 18. The interval is denoted as $2a$ in FIG. 2. The gate regions 34, in the form of islands or of a comb-like structure extend into the anode base region 14 from the cathode base region 18. A second set of gate regions 36 of n+ type conductivity or of a comb-like configuration are provided at intervals along the p-n junction 16 between the regions 12 and 14 and extend into region 14. The gate regions 36 are vertically aligned with intervals 38 between gate regions 34.

In describing a thyristor of the prior art or of this invention, when a region is described as being of p or n type conductivity, it is to be understood that it is doped to a concentration of from $10^{14}$ to $10^{17}$ atoms of dopant per cc of silicon. When a region is described as being of p+ or n+ conductivity it is doped to a concentration of from $10^{18}$ to $5 \times 10^{21}$ atoms of dopant per cc of silicon.

In a thyristor of this embodiment, it becomes possible to burden only the anode base region 14 with a voltage during the application of a forward voltage to the thyristor. The cathode base region 18 is not burdened by the voltage due to an electrostatic shield formed by the p type gate regions 34. The p type gate regions 34 are provided at the p-n junction 20 at the boundary surface between the n type anode base region 20 and the p type cathode base region 18. The cathode base region 18 has a thickness denoted as "$W_{B2}$". The p type cathode base region 18 of this embodiment may be thinner than that of the p type cathode base region of conventional thyristors as for example that shown in FIG. 1. As a result of this thinness, the time interval "$t_1$" for which electrons from the cathode emitter region 22 injected into the cathode base region 18 reach the anode base region 14 is much shorter than that time interval for the conventional thyristor shown in FIG. 1. Consequently the turn-on time for the device of this invention is reduced without reducing the withstanding voltage capability of the device.

Assuming that "$2a$" designates the mutual spacings of the p type gate regions 34, "$W_{B2}$" the width of the cathode base region 18; "Na" the impurity concentration of the cathode base region 18; and "Nd" designates the impurity concentration of the anode base region 14, while "V" designates a voltage applied across the cathode base region 18 and the p type gate regions 34, and the anode base region 14 when a forward voltage is applied across the cathode emitter region 12, and the anode emitter region 22, the spread $l_1$ of depletion layers spread into the anode base region 14 from the p type gate regions 34 is expressed by the equation:

$$l_1 = K\sqrt{V/Nd} \qquad [\text{I}]$$

where K is a constant as determined by a dielectric constant of a material forming a thyristor element and an electric charge of minority carriers, and $l_1$, V and Nd have the designation set forth above.

Like the above-mentioned expression [I], the spread $l_2$ of a depletion layer spread into the cathode base region 18 from the anode base region 14 is expressed by the following expression:

$$l_2 = K\sqrt{V/Na} \qquad [\text{II}]$$

The mutual spacings "$2a$" of the p type gate regions 34 are closed with the spread $l_1$ of the depletion layers according to the above-mentioned expression "I" so that the "OFF-state" is held while, in order to prevent the spread $l_2$ of the depletion layer according to the above-mentioned expression [II] from reaching the cathode emitter region 22 to cause the punch-through, the requirements expressed below must be met.

$$a = l_1 = K\sqrt{V/Nd} \qquad [\text{III}]$$
$$W_{B2} > l_2 = K\sqrt{V/Na} \;.$$

Accordingly, the above-mentioned expressions [III] provide the following relational expression:
$$Nd \cdot a^2 < Na \cdot W_{B2}^2 \qquad [\text{IV}]$$

If the anode base layer 14, the cathode base layer 18 and the p type gate regions 34 are set so as to fulfill the above-mentioned expression [IV] then the "OFF-state" is held without punch-through.

Also as the n+ type regions 36 are provided, the depletion layers from the periphery of the p type gate regions 39 spread equidistantly into the anode base region 14, upon the application of the forward voltage, reach the n+ type regions 36 to permit the interior of the anode base region 14 to be substantially depleted. Therefore, the anode base region 14 includes scarcely mon-depleted regions and in addition the hole density is small within the n+ type regions 36 serve to decrease the quantity of holes injected from the anode emitter region 12 thereby reducing the time interval required for holes to disappear upon "turn-off", while being capable of rendering a forward voltage drop extremely small.

While in this embodiment the island- or comb-shaped n+ type regions 36 have been provided only on those portions of the boundary between the anode base region 14 and the anode emitter region 12 in a non-opposing vertical alignment to the p type gate regions 34 it is not necessarily required to have the n+ type regions 36 in an island- or comb-shape.

Figure 3:
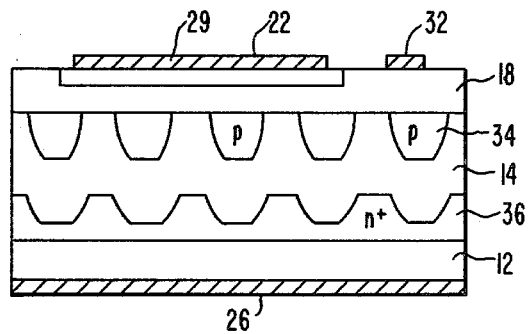
FIG. 3 is a side view, in section, of a thyristor setting forth a second embodiment of the teachings of the present invention.

As shown in FIG. 3, wherein all like parts of a thyristor have the same designation as in FIG. 2, the thickness of the n+ type region 36 may be thin on those portions thereof vertically opposed to the p type gate regions 34 and thick on those portion thereof not vertically opposed to the p type gate regions 34 thereby to give the effect similar to that of that embodiment.

While the embodiments have been described and shown with the gate electrode 32 disposed on the surface 34 of cathode base region 18, the present invention is not limited thereto and is applicable to the case the gate electrode is disposed on a surface of the anode base region.

As described above, the thyristor of the present invention is provided with the gate regions of the second type conductivity disposed at predetermined intervals on the p-n junction or boundary surface between the anode base region 14 of n type or first type conductivity and the cathode base region 18 of p type conductivity or of the second type conductivity relative to said anode base region 14 so as to protrude in the form of islands or a comb-like structure into the anode base layer of the first type conductivity from said cathode base region of second type conductivity while the high impurity concentration regions of the first type conductivity are provided only on the portions not vertically opposed to said gate regions of the gate regions on the boundary surface between said base region the first type conductivity and the emitter region of the second type conductivity. Alternatively, the high impurity concentration region of the first type conductivity is provided to be thicker on said portions than on the remaining portions. Therefore it is possible to burden only said anode base region having the first type conductivity with a forward voltage upon its application but without burdening said cathode base layer of the second type conductivity therewith. Thus, the thickness of said cathode base region of the second type conductivity can be sharply thinner than that of the conventional prior art thyristor of FIG. 1. Thereby, the time interval for which carriers from the cathode emitter layer of the first type conductivity injected into said cathode base layer of the second type conductivity are diffused into the cathode base region of the second type conductivity to reach said anode base region of the first type conductivity is shorter than that of the conventional prior art devices and the faster speeding "turn-on" can be accomplished without the withstanding voltage being lowered.

Also, upon the application of a forward voltage, depletion layers spread equidistantly into said anode base region of the first type conductivity from the peripheries of said gate regions of the first type conductivity to reach said region of the first type conductivity to deplete substantially the interior of said anode base region of the first type conductivity can decrease the quantity of carriers injected from the cathode emitter region, of the second type conductivity, to shorten the time interval required for carriers to be withdrawn upon "turn-off".

I claim as my invention:

1. A thyristor comprising a body of semiconductor material, said body having major opposed top and bottom surfaces, a first emitter region of a first type conductivity, a first base region of a second type conductivity adjacent to said first emitter region, a p-n junction between said first emitter region and said first base region, a second base region of the first type conductivity adjacent to said first base region, a p-n junction between said first and said second base region, a second emitter region of the second type conductivity adjacent to said second base region, a p-n junction between said second base region and said second emitter region, a first metal electrode in an ohmic electrical contact relationship with said first emitter region, a second metal electrode in an ohmic electrical contact relationship with said second emitter region, a third metal electrode in an ohmic electrical contact relationship with one of said base regions, a plurality of gate regions having said second type of conductivity spaced apart of predetermined intervals on said p-n junction between said second base region and said first base region and protruding into said base region a predetermined distance, said predetermined distance being less than the thickness of said second base region, a plurality of highly doped regions having said second type of conductivity disposed at predetermined intervals along the p-n junction between said second emitter region and the second base region and protruding into said second base region a predetermined distance, said predetermined distance being less than the thickness of said second base region, said highly doped regions being vertically aligned with the intervals between said gate regions.

2. The thyristor of claim 1 in which said plurality of highly doped regions having said second type of conductivity disposed at predetermined intervals along the p-n junction between the second emitter region and the second base region and protruding into said second region are physically joined by another highly doped region having said second type of conductivity formed within said second base region along the p-n junction between said second emitter and said second base region, said another highly doped region having a thickness less than the thickness of said plurality of highly doped regions which it physically joins.

3. The thyristor of claims 1 or 2 in which said third metal electrode is in an ohmic electrical contact relationship with said first base region.

4. The thyristor of claim 1 in which said first type of conductivity is n type conductivity and said second type conductivity is p type conductivity.

5. The thyristor of claims 1 or 2 in which said first electrode is affixed to said top surface of the body of semiconductor material, said second electrode is affixed to the bottom surface of said body and said third electrode is affixed to said top surface of said body.

* * * * *